April 26, 1966 A. DANCHUK ETAL 3,248,471

HEAT SINKS

Filed Feb. 7, 1962

INVENTORS
ALEX DANCHUK
WILLIAM L. PETERSON
BY Herbert L. Davis
ATTORNEY 3,248,471
HEAT SINKS
Alex Danchuk, Livingston, and William L. Peterson, Hackensack, N.J., assignors to The Bendix Corporation, Teterboro, N.J., a corporation of Delaware
Filed Feb. 7, 1962, Ser. No. 171,746
2 Claims. (Cl. 174—15)

Figure 1:
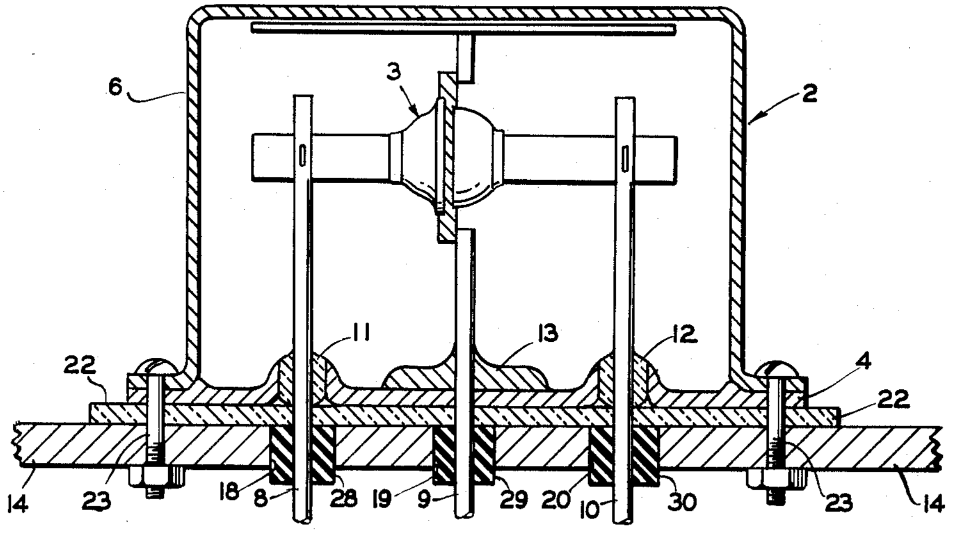

The invention relates in general to heat sinks and in particular to insulated heat sinks applicable to transistors and other semiconductor devices.

One of the problems encountered has been the provision of adequate means for effectively dissipating the heat generated in a transistor during normal operation while providing a relatively small package within which the transistor may be mounted.

Commercially available types include finned radiators fitted over the transistor and having a metal disk clamped or welded to the transistor base header.

The latter type heat sink has proved most effective, since it provides lowest thermal impedance between the junction pellet and the outside ambient. Its efficiency, however, is governed by the area of metal exposed to the ambient with which the heat sink is in thermal contact. In such arrangements, one of the elements of the transistor is provided in electrical contact and in heat transmitting relation with the header base so that the heat generated in the normal operation of the transistor may be effectively dissipated through the transistor case and heat sink. The transistor case, however, must be electrically insulated from the metal surface of the heat radiation body which in the conventional arrangement is electrically connected to a ground common with other circuit elements used in the transistor circuit configuration.

Several special type insulators are available for this purpose which offer a low thermal impedance while maintaining a relatively high dielectric resistance; but in each case, special fasteners—such as nylon screws or inserts for insulated metal screws—must be used to mount the transistor assembly to the plate. These fasteners increase assembly costs and are subject to distortion due to temperature variation and cold flow which eventually results in impairing thermal contact between the heat sink and metal surface of the heat radiating body with a resultant reduction in transistor reliability.

In order to overcome these problems, a novel arrangement and method of fastening has been provided to avoid the disadvantages in the previous arrangement and method.

An object of the invention is to provide an improved insulated heat sink over the prior conventional structure.

Another object of the invention is to provide a novel insulated heat sink unaffected by thermal cycling.

Another object of the invention is to provide a novel and improved heat sink having thermal conductivity between a transistor case and a heat radiator disk while at the same time providing electrical insulation therebetween.

Another object of the invention is to provide a novel heat sink having an adhesive member bonding together the heat radiating disk and the device being cooled, said bond being unaffected by thermal cycling of the device being cooled and the adhesive member being of a material providing both electrical insulation and thermal conduction between the heat radiating disk and said device.

A further object of the invention is the provision of a process whereby a transistor may be mechanically bonded to a heat radiating body by a member of a suitable adhesive material having thermal conductive and electrical insulation properties so as to provide thermal conduction from the transistor to the heat radiating body while simultaneously providing electrical insulation and an adhesive bond between the heat radiating body and the transistor, which is unaffected by thermal cycling.

These and other objects and features of the invention are pointed out in the following description in terms of the embodiment thereof which is shown in the accompanying drawing of FIGURE 2. It is to be understood, however, that the drawing of FIGURE 2 is for the purpose of illustration only and is not a definition of the limits of the invention, reference being had to the appended claims for this purpose.

In the drawings:

FIGURE 1 is an enlarged fragmentary sectional view of a conventional arrangement for mounting an electrical apparatus to be cooled in a heat sink and showing a header base, a transistor, a casing surrounding the transistor, a dielectric member, film and heat radiating disk being clamped together in a conventional manner by means of screws or bolts made of nonconducting material such as Teflon.

Figure 2:
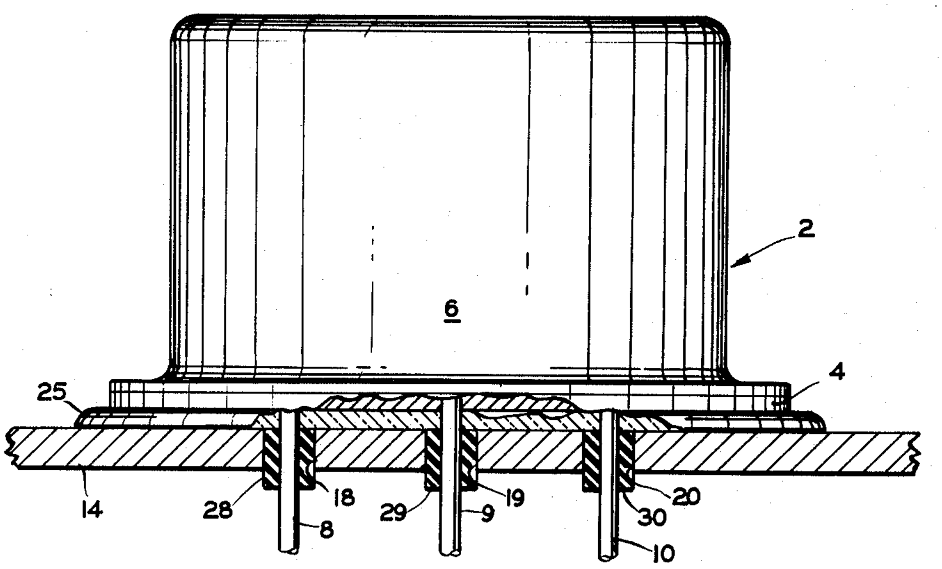

FIGURE 2 is an enlarged fragmentary sectional view of the herein described improved arrangement and method for mounting the electrical apparatus of FIGURE 1 which is to be cooled in a heat sink and showing the transistor casing and header base bonded to a heat radiating body or disk by a novel bonding member of a suitable adhesive material having both thermal conductive and electrical insulation properties.

Referring to the drawing of FIGURE 1, there is shown a transistor 3 of conventional structure mounted therein. A case 2 is formed of a suitable metal material and includes a header base 4 and shell 6 mounted thereon.

Three electrical conductors 8, 9, and 10 lead from the emitter, base, and collector elements respectively of the transistor 3. The conductors 8 and 10 are mounted in electrical insulating glass beads 11 and 12 affixed in the header base 4 through which the conductors 8 and 10 extend while the conductor 9 forms a thick window to minimize thermal impedance to the header base 4 and is welded thereto at 13 to provide a good heat conducting path from the base element of the transistor 3 to the header base 4 and shell 6 of the case 2 so as to effectively dissipate the heat generated in the transistor 3 during the normal operation thereof.

The three electrical conductors 8, 9, and 10 protrude from the transistor 3 within the shell 6 and through the base 4. A cooling radiating body 14 of a suitable metal disk type is thermally connected to the header base 4 of the transistor case 2. The heat radiator disk 14 has three holes 18, 19, and 20 for the conductors 8, 9 and 10 to pass respectively therethrough. The radiating body or disk 14 should make good thermal contact with the base 4 of the header 2 so that heat from the transistor flows to the radiating body 14, whose large surface area dissipates the heat in the ambient environment.

Since the electrical conductor 9 leading from the base element of the transistor 3 is electrically connected to the metal header base 4 to provide a good conducting path thereto so as to effect the desired heat dissipation, and since heat radiating body or disk 14 is electrically connected to a ground common to other circuit elements used in the circuit configuration of the transistor 3, it will be seen that the header base 4 and shell 6 for some applications must be electrically insulated from the metal surface of the disk 14.

Heretofore, under the prior conventional practice, there has been utilized an electrical insulation member 22 of a high dielectric strength material such as mica, Mylar, or a mica bonded glass silicone in the form of an electrical insulating washer. A light coating of a silicone grease was usually applied to all surfaces to maintain the thermal resistance as low as possible. However, in such prior structures, it has been heretofore necessary to clamp the header base 4, insulation member 22, and heat radiating disk 14 together by means of screws or bolts 23 made of an electrically nonconducting material such as Teflon.

In the prior conventional structure, during the thermal cycling of the transistor 3 (i.e. the transistor 3 successively heating and cooling), the Teflon screws 23 became soft and mushy due to the high temperatures of the heat applied thereto in the normal operation of the transistor 3 and were no longer capable of clamping the transistor case 2 and dielectric member 22 firmly together, thereby permitting air to enter the space between the dielectric member 22 and the heat radiating disk 14 so as to impair the thermal conductivity between the transistor case 2 and the heat radiating disk 14.

In FIGURE 2, the improved form of the invention is shown in which like numerals indicate corresponding parts to those heretofore described with reference to FIGURE 1.

In the improved form of FIGURE 2, the metal heat radiating body or disk 14 and the metal header base 4 of the transistor case 2 are shown separated by an improved electrical insulating member or tape 25 having the properties of being (1) a thermal conductor, (2) an electrical insulator, and (3) an adhesive. For example, the material of the member 25 may be an epoxy resin having the above three properties. In practice, it has been found efficient to work with a tack-free B-staged epoxy pre-preg prepared in thin sheets or in tape several mills in thickness. Tapes of this type are commercially available, and one type found satisfactory is commercially known as Filmex 80 L–E, sold by Mansol Ceramics Corporation, of Belleville, New Jersey.

The material of the member 25 simultaneously (1) conducts heat from the metal transistor case 2 to the metal heat radiating body 14, (2) electrically insulates the case 2 from the heat radiating body or disk 14, and (3) adheres the case 2 and the heat radiating body or disk 14, and (3) adheres the case 2 and the heat radiating body 14 to each other in adjacent spacial relation. The adhesive, electrical insulating, and thermal conducting properties of the material of the member 25 are unaffected by thermal cycling of the transistor 2.

The heat radiating body 14 is also to be electrically insulated from the transistor leads 8, 9, and 10. The insulation may be accomplished, as is the common practice, by making the holes 18, 19, and 20 (provided for the leads 8, 9, and 10) large enough so that there is an air space insulation between conductors 8, 9, and 10 and the heat radiating body 14, at the location where the conductors 8, 9, and 10 pass through the body 14. Alternatively, and as shown in the FIGURES 1 and 2, each of the conductors 8, 9, and 10 is encased in an insulating sleeving 28, 29, and 30, respectively, which may be of Teflon or any other convenient or conventional insulating material, and of a length not less than the thickness of the heat radiating body 14, thereby electrically insulating the conductors 8, 9, and 10 of the transistor from the heat radiating body 14. The insulating sleeving may be held in place mechanically by being forced into the holes 18, 19, and 20 or by the adhesive properties of the member 25, or as shown in FIGURE 2, a combination of the two.

The epoxy material described above is also an excellent adhesive. The B-staged epoxy pre-preg mentioned above is of the heat setting type and, when properly set, provides an excellent bond uneffected by heat (thermal cycling) and electrical change. The adhesive is prepared as follows: first cut a wafer slightly larger than the base header with three holes for the conductor. Apply acetate to make the wafer slightly tacky. Place the wafer between base header and radiating body, and bake in a moderate oven at 350° F. for 30 minutes. A slight pressure on the order of 50 grams may be applied to the case and the radiating body during baking.

The invention as shown in FIGURE 2 may be applied to a transistor 3 encapsulated in a case 2 and with a heat radiating body 14 of the disk type. It should be understood that the radiating body 14 may be of any convenient or conventional type, that the transistor case 2 and lead configuration may be of any type, and that the invention is not limited to spacial configuration of the radiating body 14 connected to the base of the transistor case 2. Furthermore, it should be understood that the novel heat sink described can be used with devices other than transistors, such as power rectifiers, but the invention is not limited to semiconductor devices and may be used as a heat sink wherever applicable.

Although only one embodiment of the invention has been illustrated and described, various changes in the form and relative arrangement of the parts, which will now appear to those skilled in the art may be made without departing from the scope of the invention. Reference is, therefore, to be had to the appended claims for a definition of the limits of the invention.

What is claimed is:

1. A heat sink comprising in combination a binding means of a material having the properties of electrical insulation, thermal conduction, and adhesiveness, a transistor encapsuled in a case with a base portion on said case, electrical conductors extending from said base portion and through said binding means, a radiating body of a heat conducting material affixed to the base portion of said case by said binding means and in spaced relation thereto, said radiating body having apertures therethrough and electrical insulating means within the apertures in fixed relation therein for the passage of the electrical conductors through the radiating body, and said transistor case, radiating body and electrical insulating means being held in the aforesaid fixed relations by the adhesive properties of the material of said binding means.

2. A heat sink comprising in combination (a) a member of an epoxy resin material having the properties of electrical insulation, thermal conduction, and adhesiveness, (b) a transistor encapsuled in a case having a base portion on said case and electrical conductors extending from said base portion, (c) a heat radiator of a heat conducting material having a surface positioned adjacent to said base portion and affixed by said member in contacting thermal conducting relation therewith, said heat radiator having apertures therethrough for the passage of the electrical conductors, (d) insulating means within the apertures to surround portions of the electrical conductors extending through the radiator, and said insulating means being fixedly positioned in said apertures by the adhesive properties of the epoxy resin material of said member.

References Cited by the Examiner

UNITED STATES PATENTS

| | | | |
|---|---|---|---|
| 2,817,048 | 12/1957 | Thuemel et al. | 317—234 |
| 2,975,928 | 3/1961 | Roovers | 317—235 |
| 3,025,437 | 3/1962 | Van Namen | 317—235 |
| 3,041,510 | 6/1962 | Hower | 317—235 |

DAVID J. GALVIN, *Primary Examiner.*

GEORGE N. WESTBY, *Examiner.*